United States Patent
Kao

(10) Patent No.: US 11,112,820 B1
(45) Date of Patent: Sep. 7, 2021

(54) METHOD FOR TRANSMITTING SIGNALS BETWEEN DOMAINS HAVING DIFFERENT CLOCKS, CIRCUIT, AND ELECTRONIC APPARATUS THEREOF

(71) Applicant: HON HAI PRECISION INDUSTRY CO., LTD., New Taipei (TW)

(72) Inventor: Yi-Lang Kao, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 17/021,584

(22) Filed: Sep. 15, 2020

(30) Foreign Application Priority Data

Jul. 3, 2020 (CN) .......................... 202010635779.X

(51) Int. Cl.
*G06F 1/12* (2006.01)
*G06F 13/24* (2006.01)
*G06F 1/10* (2006.01)
*H03K 19/20* (2006.01)
*H03K 3/037* (2006.01)

(52) U.S. Cl.
CPC .................. *G06F 1/12* (2013.01); *G06F 1/10* (2013.01); *G06F 13/24* (2013.01); *H03K 3/037* (2013.01); *H03K 19/20* (2013.01)

(58) Field of Classification Search
CPC .. G06F 1/10; G06F 1/12; G06F 13/24; H03K 3/0375
See application file for complete search history.

(56) References Cited

U.S. PATENT DOCUMENTS

| | | | | |
|---|---|---|---|---|
| 7,934,113 | B2* | 4/2011 | Chard | H04L 7/02 713/500 |
| 8,027,420 | B2* | 9/2011 | McCabe | G06F 5/06 375/354 |
| 8,659,336 | B2* | 2/2014 | Kulmala | H03K 5/1534 327/198 |
| 10,014,041 | B1* | 7/2018 | Khare | G11C 7/222 |
| 10,788,853 | B2* | 9/2020 | Soni | G06F 13/24 |
| 10,924,091 | B2* | 2/2021 | Goyal | H03K 19/21 |

* cited by examiner

*Primary Examiner* — Patrick O Neill
(74) *Attorney, Agent, or Firm* — ScienBiziP, P.C.

(57) ABSTRACT

A signal transmitting circuit providing compatibility and stability in signal transmissions across domains with different clock frequencies includes an edge detection circuit, a flip circuit, a synchronization circuit, and an edge extraction circuit. The edge detection circuit detects an edge of an initial interrupt signal and generates an event trigger signal in a faster clock domain. The flip circuit converts the event trigger signal into an edge signal. The synchronization circuit synchronizes the edge signal under a slower clock domain and generates a synchronization signal. The edge extraction circuit generates a trigger signal based on the synchronization signal in the slower clock domain to a target circuit in the slower clock domain. A method and an electronic apparatus related to the signal transmitting circuit are also disclosed.

20 Claims, 3 Drawing Sheets

METHOD FOR TRANSMITTING SIGNALS BETWEEN DOMAINS HAVING DIFFERENT CLOCKS, CIRCUIT, AND ELECTRONIC APPARATUS THEREOF

FIELD

The subject matter herein generally relates to signal transmission between different clock domains.

BACKGROUND

Signals in circuit can be transmitted between domains governed by different clocks. For example, signals can be generated by a processor in a faster clock domain, and signals in peripheral circuits in a slower clock domain can be generated. Signals transmitted from the faster clock domain to the slower clock domain need to be synchronized by a synchronizer circuit. When an interrupt signal is transmitted from the faster clock domain to the slower clock domain, the synchronizer circuit can generate more than one synchronized interrupt signal, or it may fail to output a synchronized interrupt signal, thus the circuit in the slower clock domain will repeatedly execute interrupt operations based on the repeated interrupt signals, or it may fail to execute an operation required by the interrupt signal.

Thus, there is room for improvement in the art.

BRIEF DESCRIPTION OF THE FIGURES

Implementations of the present disclosure will now be described, by way of example only, with reference to the attached figures.

DETAILED DESCRIPTION

Figure 1:
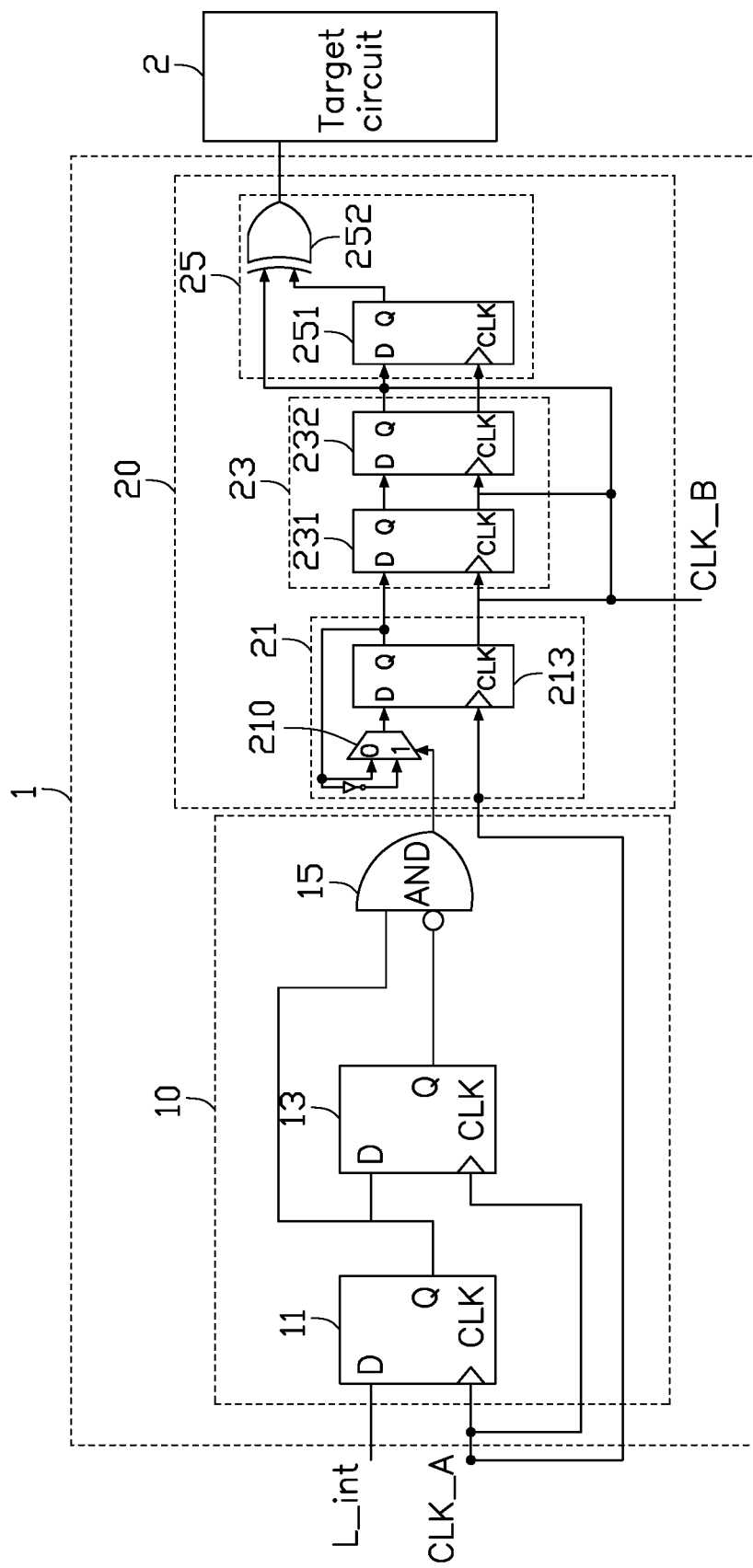
FIG. 1 is a circuit diagram illustrating an embodiment of a signal transmitting circuit for different clock domains.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

The term "comprising" means "including, but not necessarily limited to"; it specifically indicates open-ended inclusion or membership in a so-described combination, group, series, and the like. The disclosure is illustrated by way of example and not by way of limitation in the figures of the accompanying drawings in which like references indicate similar elements. It should be noted that references to "an" or "one" embodiment in this disclosure are not necessarily to the same embodiment, and such references can mean "at least one."

The present disclosure provides a signal transmitting circuit in different clock domains.

FIG. 1 shows a circuit of a signal transmitting circuit 1 operated in different clock domains. The signal transmitting circuit 1 is used in an electronic apparatus (not shown) with different clock domains. The signal transmitting circuit 1 can synchronize an initial interrupt signal L_int in a faster clock domain with the signals in a slower clock domain and generate a trigger interrupt signal to a target circuit 2. The signal transmitting circuit 1 can include an edge detection circuit 10 and a pulse synchronization circuit 20. In one embodiment, the edge detection circuit 10 and the pulse synchronization circuit 20 can be embedded in one integrated circuit, and also can be two independent circuits.

Figure 2:
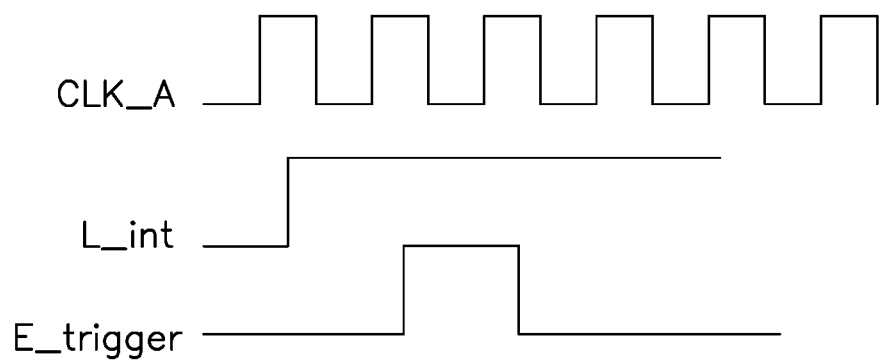
FIG. 2 is a timing chart showing waveforms of the initial interrupt signal, a first clock signal, and an event trigger signal.

The edge detection circuit 10 is operating under a faster clock domain. The edge detection circuit 10 detects an edge of the initial interrupt signal L_int and generates an event trigger signal E_trigger. In one embodiment, the event trigger signal E_trigger is a single pulse signal. The edge detection circuit 10 includes a first trigger 11, a second trigger 13, and a logic circuit 15. A signal input terminal D of the first trigger 11 receives the initial interrupt signal L_int. A clock terminal CLK of the first trigger 11 receives a first clock signal CLK_A. An output terminal Q of the first trigger 11 is electrically connected with the second trigger 13 and the logic circuit 15. A signal input terminal D of the second trigger 13 is electrically connected with the output terminal Q of the first trigger 11. A clock terminal CLK of the second trigger 13 receives the first clock signal CLK_A. An output terminal Q of the second trigger 13 is electrically connected with an inverting input terminal of the logic circuit 15. An input terminal of the logic circuit 15 is electrically connected with the output terminal Q of the first trigger 11. An output terminal of the logic circuit 15 is electrically connected to the pulse synchronization circuit 20. In one embodiment, the logic circuit 15 is an AND gate. The first clock signal CLK_A is in the faster clock domain. FIG. 2 shows the waveforms of the initial interrupt signal L_int, the first clock signal CLK_A, and the event trigger signal E_trigger. The high-level in the initial interrupt signal L_int serves as the initial interrupt signal L_int.

The pulse synchronization circuit 20 is electrically connected with the edge detection circuit 10. The pulse synchronization circuit 20 receives the event trigger signal E_trigger in the faster clock domain and generates a trigger interrupt signal under the slower clock domain. The pulse synchronization circuit 20 can include a flip circuit 21, a synchronization circuit 23, and an edge extraction circuit 25.

The flip circuit 21 is operated under the faster clock domain. The flip circuit 21 converts the event trigger signal E_trigger into an edge signal. The flip circuit 21 can include a multiplexer 210 and a third trigger 213. An input terminal of the multiplexer 210 is electrically connected with the output terminal of the logic circuit 15. An output terminal of the multiplexer 210 is electrically connected with an input terminal D of the third trigger 213. A clock terminal CLK of the third trigger 213 receives the first clock signal CLK_A. An output terminal Q of the third trigger 213 is electrically connected with the synchronization circuit 23.

The synchronization circuit 23 is operated under the slower clock domain. The synchronization circuit 23 synchronizes the edge signal under the slower clock domain and generates a synchronization signal. The synchronization circuit 23 includes a fourth trigger 231 and a fifth trigger 232. An input terminal D of the fourth trigger 231 is electrically connected with the output terminal Q of the third trigger 213. A clock terminal CLK of the fourth trigger 231 receives a second clock signal CLK_B. An output terminal Q of the fourth trigger 231 is electrically connected with an input terminal D of the fifth trigger 232. A clock terminal CLK of the fifth trigger 232 receives the second clock signal CLK_B. An output terminal Q of the fifth trigger 232 is electrically connected with the edge extraction circuit 25. In one embodiment, the second clock signal CLK_B is in the slower clock domain. A frequency of the first clock signal CLK_A is higher than a frequency of the second clock signal CLK_B.

The edge extraction circuit 25 is operated under the slower clock domain. The edge extraction circuit 25 under the slower clock domain generates the trigger signal based on the synchronization signal. The edge extraction circuit 25 can include a sixth trigger 251 and a second logic circuit 252. An input terminal D of the sixth trigger 251 is electrically connected with the output terminal Q of the fifth trigger 232. A clock terminal CLK of the sixth trigger 251 receives the second clock signal CLK_B. An output terminal Q of the sixth trigger 251 is electrically connected with a second input terminal of the second logic circuit 252. A first input terminal of the logic circuit 252 is electrically connected with the output terminal Q of the fifth trigger 232. In one embodiment, the second logic circuit 252 is an exclusive-OR gate.

The structure of the signal transmitting circuit 1 allows the edge detection circuit 10 to convert the interrupt signal into a single pulse signal, and the synchronization circuit 23 synchronizes the single pulse signal with the slower clock domain and generates a synchronization signal. This ensures that only one trigger interrupt signal is generated while the interrupt signal is transmitted from the faster clock domain to the slower clock domain, and the stability of the electronic apparatus is ensured.

Figure 3:
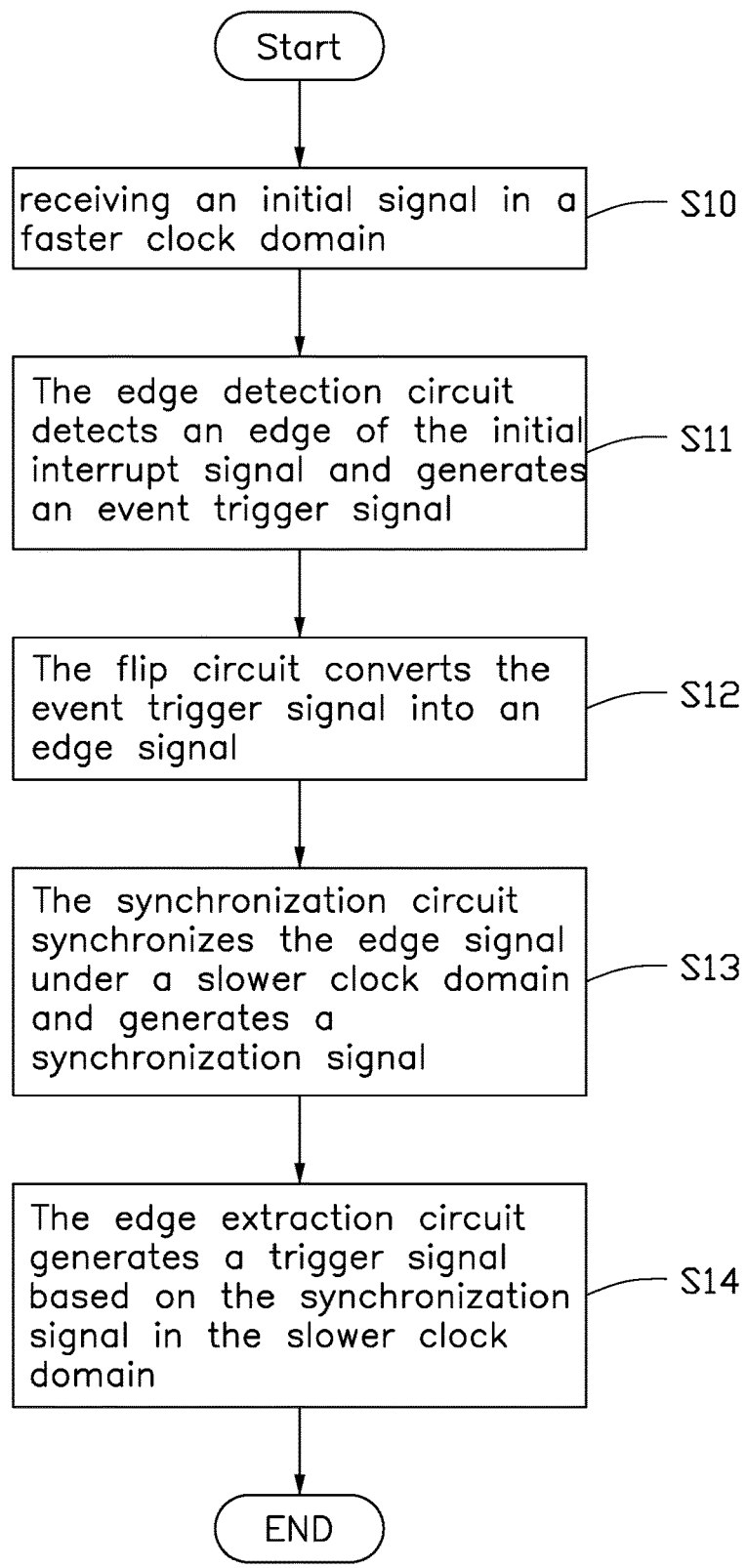
FIG. 3 is a flowchart illustrating an embodiment of method for transmitting signals across different clock domains.

FIG. 3 show a method for the above. The method is used in the signal transmitting circuit 1 in an electronic apparatus. The method may comprise at least the following blocks, which also may be applied in a different order:

In block 10, an initial signal in a faster clock domain is received.

In block 11, the edge detection circuit 10 detects an edge of the initial interrupt signal L_int and generates an event trigger signal E_trigger.

In one embodiment, the event trigger signal E_trigger is a single pulse signal. The edge detection circuit 10 includes a first trigger 11, a second trigger 13, and a logic circuit 15. A signal input terminal D of the first trigger 11 receives the initial interrupt signal L_int. A clock terminal CLK of the first trigger 11 receives a first clock signal CLK_A. An output terminal Q of the first trigger 11 is electrically connected with the second trigger 13 and the logic circuit 15. A signal input terminal D of the second trigger 13 is electrically connected with the output terminal Q of the first trigger 11. A clock terminal CLK of the second trigger 13 receives the first clock signal CLK_A. An output terminal Q of the second trigger 13 is electrically connected with an inverting input terminal of the logic circuit 15. An input terminal of the logic circuit 15 is electrically connected with the output terminal Q of the first trigger 11. An output terminal of the logic circuit 15 is electrically connected to the pulse synchronization circuit 20. In one embodiment, the logic circuit 15 is an AND gate. The first clock signal CLK_A is in the faster clock domain. FIG. 2 shows the waveforms of the initial interrupt signal L_int, the first clock signal CLK_A, and the event trigger signal E_trigger. The high-level signal in the initial interrupt signal L_int serves as the initial interrupt signal L_int.

In block 12, the flip circuit 21 converts the event trigger signal E_trigger into an edge signal.

In one embodiment, the flip circuit 21 can include a multiplexer 210 and a third trigger 213. An input terminal of the multiplexer 210 is electrically connected with the output terminal of the logic circuit 15. An output terminal of the multiplexer 210 is electrically connected with an input terminal D of the third trigger 213. A clock terminal CLK of the third trigger 213 receives the first clock signal CLK_A. An output terminal Q of the third trigger 213 is electrically connected with the synchronization circuit 23.

In block 13, the synchronization circuit 23 synchronizes the edge signal under the slower clock domain and generates a synchronization signal.

In one embodiment, synchronization circuit 23 includes a fourth trigger 231 and a fifth trigger 232. An input terminal D of the fourth trigger 231 is electrically connected with the output terminal Q of the third trigger 213. A clock terminal CLK of the fourth trigger 231 receives a second clock signal CLK_B. An output terminal Q of the fourth trigger 231 is electrically connected with an input terminal D of the fifth trigger 232. A clock terminal CLK of the fifth trigger 232 receives the second clock signal CLK_B. An output terminal Q of the fifth trigger 232 is electrically connected with the edge extraction circuit 25. In one embodiment, the second clock signal CLK_B is in the slower clock domain. A frequency of the first clock signal CLK_A is higher than a frequency of the second clock signal CLK_B.

In block 14, the edge extraction circuit 25 under the slower clock domain generates the trigger signal based on the synchronization signal.

In one embodiment, the edge extraction circuit 25 can include a sixth trigger 251 and a second logic circuit 252. An input terminal D of the sixth trigger 251 is electrically connected with the output terminal Q of the fifth trigger 232. A clock terminal CLK of the sixth trigger 251 receives the second clock signal CLK_B. An output terminal Q of the sixth trigger 251 is electrically connected with a second input terminal of the second logic circuit 252. A first input terminal of the logic circuit 252 is electrically connected with the output terminal Q of the fifth trigger 232. In one embodiment, the second logic circuit 252 is an exclusive-OR gate.

The edge detection circuit 10 thus converts the interrupt signal into a single pulse signal, and the synchronization circuit 23 synchronizes the single pulse signal with the slower clock domain and generates a synchronization signal, ensuring that only one trigger interrupt signal is generated while the interrupt signal is transmitted from the faster clock domain to the slower clock domain, and the stability of the electronic apparatus is ensured.

While various and preferred embodiments have been described the disclosure is not limited thereto. On the contrary, various modifications and similar arrangements (as would be apparent to those skilled in the art) are also intended to be covered. Therefore, the scope of the appended claims should be accorded the broadest interpretation so as to encompass all such modifications and similar arrangements.

What is claimed is:

1. A method for transmitting signals between different clock domains used in an electronic apparatus, the electronic apparatus comprises an edge detection circuit and a pulse synchronization circuit; the method comprising:

receiving an initial interrupt signal in a faster clock domain by the edge detection circuit;

detecting an edge of the initial interrupt signal and generating an event trigger signal by the edge detection circuit;

converting the event trigger signal into an edge signal by the pulse synchronization circuit;

synchronizing the edge signal under a slower clock domain and generating a synchronization signal by the pulse synchronization circuit; and generating a trigger signal based on the synchronization signal in the slower clock domain by the pulse synchronization circuit to a target circuit in the slower clock domain.

2. The method of claim 1, wherein the edge detection module comprises first trigger, a second trigger, and a logic circuit; a signal input terminal of the first trigger receives the initial interrupt signal; a clock terminal of the first trigger receives a first clock signal; an output terminal of the first trigger is electrically connected with the second trigger and the logic circuit; a signal input terminal of the second trigger is electrically connected with the output terminal of the first trigger; a clock terminal of the second trigger receives the first clock signal; an output terminal of the second trigger is electrically connected with an inverting input terminal of the logic circuit; an input terminal of the logic circuit is electrically connected with the output terminal of the first trigger; an output terminal of the logic circuit is electrically connected to the pulse synchronization circuit.

3. The method of claim 2, wherein the event trigger signal is a single pulse signal; the logic circuit is a AND gate.

4. The method of claim 2, wherein the pulse synchronization circuit comprises a flip circuit, a synchronization circuit, and an edge extraction circuit; the flip circuit comprises a multiplexer and a third trigger; an input terminal of the multiplexer is electrically connected with the output terminal of the logic circuit; an output terminal of the multiplexer is electrically connected with an input terminal of the third trigger; a clock terminal of the third trigger receives the first clock signal; an output terminal of the third trigger is electrically connected with the synchronization circuit.

5. The method of claim 4, wherein the synchronization circuit comprises a fourth trigger and a fifth trigger; an input terminal of the fourth trigger is electrically connected with the output terminal of the third trigger; a clock terminal of the fourth trigger receives a second clock signal; an output terminal of the fourth trigger is electrically connected with an input terminal of the fifth trigger; a clock terminal of the fifth trigger receives the second clock signal; an output terminal of the fifth trigger is electrically connected with the edge extraction circuit; a frequency of the first clock signal is higher than a frequency of the second clock signal.

6. The method of claim 5, wherein the edge extraction circuit comprises a sixth trigger and a second logic circuit; an input terminal of the sixth trigger is electrically connected with the output terminal of the fifth trigger; a clock terminal of the sixth trigger receives the second clock signal; an output terminal of the sixth trigger is electrically connected with a second input terminal of the second logic circuit; a first input terminal of the logic circuit is electrically connected with the output terminal of the fifth trigger; the second logic circuit is an exclusive-OR gate.

7. A signal transmitting circuit comprising:

an edge detection circuit, configured to detect an edge of an initial interrupt signal and generate an event trigger signal in a faster clock domain;

a flip circuit, configured to convert the event trigger signal into an edge signal a synchronization circuit, configured to synchronize the edge signal under a slower clock domain and generate a synchronization signal; and an edge extraction circuit, configured to generate a trigger signal based on the synchronization signal in the slower clock domain to a target circuit in the slower clock domain.

8. The signal transmitting circuit of claim 7, wherein the edge detection module comprises first trigger, a second trigger, and a logic circuit; a signal input terminal of the first trigger receives the initial interrupt signal; a clock terminal of the first trigger receives a first clock signal; an output terminal of the first trigger is electrically connected with the second trigger and the logic circuit; a signal input terminal of the second trigger is electrically connected with the output terminal of the first trigger; a clock terminal of the second trigger receives the first clock signal; an output terminal of the second trigger is electrically connected with an inverting input terminal of the logic circuit; an input terminal of the logic circuit is electrically connected with the output terminal of the first trigger; an output terminal of the logic circuit is electrically connected to the pulse synchronization circuit.

9. The signal transmitting circuit of claim 8, wherein the event trigger signal is a single pulse signal; the logic circuit is a AND gate.

10. The signal transmitting circuit of claim 8, wherein the flip circuit comprises a multiplexer and a third trigger; an input terminal of the multiplexer is electrically connected with the output terminal of the logic circuit; an output terminal of the multiplexer is electrically connected with an input terminal of the third trigger; a clock terminal of the third trigger receives the first clock signal; an output terminal of the third trigger is electrically connected with the synchronization circuit.

11. The signal transmitting circuit of claim 10, wherein the synchronization circuit comprises a fourth trigger and a fifth trigger; an input terminal of the fourth trigger is electrically connected with the output terminal of the third trigger; a clock terminal of the fourth trigger receives a second clock signal; an output terminal of the fourth trigger is electrically connected with an input terminal of the fifth trigger; a clock terminal of the fifth trigger receives the second clock signal; an output terminal of the fifth trigger is electrically connected with the edge extraction circuit; a frequency of the first clock signal is higher than a frequency of the second clock signal.

12. The signal transmitting circuit of claim 11, wherein the edge extraction circuit comprises a sixth trigger and a second logic circuit; an input terminal of the sixth trigger is electrically connected with the output terminal of the fifth trigger; a clock terminal of the sixth trigger receives the second clock signal; an output terminal of the sixth trigger is electrically connected with a second input terminal of the second logic circuit; a first input terminal of the logic circuit is electrically connected with the output terminal of the fifth trigger; the second logic circuit is an exclusive-OR gate.

13. An electronic apparatus comprising:

a signal transmitting circuit, configured to receive an initial interrupt signal; the signal transmitting circuit comprising:

an edge detection circuit, configured to detect an edge of an initial interrupt signal and generate an event trigger signal in a faster clock domain;

a flip circuit, configured to convert the event trigger signal into an edge signal a synchronization circuit, configured to synchronize the edge signal under a slower clock domain and generate a synchronization signal; and an edge extraction circuit, configured to generate a trigger signal based on the synchronization signal in the slower clock domain to a target circuit in the slower clock domain.

14. The electronic apparatus of claim 13, wherein the edge detection module comprises first trigger, a second trigger, and a logic circuit; a signal input terminal of the first trigger receives the initial interrupt signal; a clock terminal of the first trigger receives a first clock signal; an output terminal of the first trigger is electrically connected with the second trigger and the logic circuit; a signal input terminal of the second trigger is electrically connected with the output terminal of the first trigger; a clock terminal of the second trigger receives the first clock signal; an output terminal of the second trigger is electrically connected with an inverting input terminal of the logic circuit; an input terminal of the logic circuit is electrically connected with the output terminal of the first trigger; an output terminal of the logic circuit is electrically connected to the pulse synchronization circuit.

15. The electronic apparatus of claim 14, wherein the event trigger signal is a single pulse signal; the logic circuit is a AND gate.

16. The electronic apparatus of claim 14, wherein the flip circuit comprises a multiplexer and a third trigger; an input terminal of the multiplexer is electrically connected with the output terminal of the logic circuit; an output terminal of the multiplexer is electrically connected with an input terminal of the third trigger; a clock terminal of the third trigger receives the first clock signal; an output terminal of the third trigger is electrically connected with the synchronization circuit.

17. The electronic apparatus of claim 16, wherein the synchronization circuit comprises a fourth trigger and a fifth trigger; an input terminal of the fourth trigger is electrically connected with the output terminal of the third trigger; a clock terminal of the fourth trigger receives a second clock signal; an output terminal of the fourth trigger is electrically connected with an input terminal of the fifth trigger; a clock terminal of the fifth trigger receives the second clock signal; an output terminal of the fifth trigger is electrically connected with the edge extraction circuit.

18. The electronic apparatus of claim 13, wherein a frequency of a first clock signal in the faster clock domain is higher than a frequency of a second clock signal in the slower clock domain.

19. The electronic apparatus of claim 17, wherein the edge extraction circuit comprises a sixth trigger and a second logic circuit; an input terminal of the sixth trigger is electrically connected with the output terminal of the fifth trigger; a clock terminal of the sixth trigger receives the second clock signal; an output terminal of the sixth trigger is electrically connected with a second input terminal of the second logic circuit; a first input terminal of the logic circuit is electrically connected with the output terminal of the fifth trigger.

20. The electronic apparatus of claim 19, wherein the second logic circuit is an exclusive-OR gate.

* * * * *